United States Patent
Willner

(10) Patent No.: US 9,427,946 B2
(45) Date of Patent: *Aug. 30, 2016

(54) METHODS AND APPARATUS FOR TRANSFER OF FILMS AMONG SUBSTRATES

(71) Applicant: Graphene Frontiers, Philadelphia, PA (US)

(72) Inventor: Bruce Ira Willner, Lawrenceville, NJ (US)

(73) Assignee: GRAPHENE FRONTIERS, Philadelphia, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/445,746

(22) Filed: Jul. 29, 2014

(65) Prior Publication Data

US 2014/0332141 A1 Nov. 13, 2014

Related U.S. Application Data

(63) Continuation of application No. 14/099,032, filed on Dec. 6, 2013, now Pat. No. 8,822,308.

(60) Provisional application No. 61/797,471, filed on Dec. 7, 2012.

(51) Int. Cl.
*H01L 21/02* (2006.01)
*H01L 21/67* (2006.01)
(Continued)

(52) U.S. Cl.
CPC ............. *B32B 37/24* (2013.01); *B32B 38/08* (2013.01); *C01B 31/0484* (2013.01);
(Continued)

(58) Field of Classification Search
CPC .......... H01L 29/1606; H01L 21/2007; H01L 21/8258; H01L 51/5253
USPC ........... 438/455, 457–458, 460; 257/E21.48, 257/E21.122, E21.568, E21.57
See application file for complete search history.

(56) References Cited

U.S. PATENT DOCUMENTS

| 5,373,339 A | 12/1994 | Greene et al. |
| 2007/0023867 A1 | 2/2007 | Aulnette et al. |

(Continued)

FOREIGN PATENT DOCUMENTS

| CN | 1026560156 A | 9/2012 |
| CN | 102719877 A | 10/2012 |

(Continued)

OTHER PUBLICATIONS

International Search Report and Written Opinion dated Apr. 15, 2014 corresponding to International Patent Application No. PCT/US13/73585, 12 pages.

(Continued)

*Primary Examiner* — Mohsen Ahmadi
(74) *Attorney, Agent, or Firm* — Dentons US LLP

(57) ABSTRACT

A method is disclosed which includes: forming at least one layer of material on at least part of a surface of a first substrate, wherein a first surface of the at least one layer of material is in contact with the first substrate thereby defining an interface; attaching a second substrate to a second surface of the at least one layer of material; forming bubbles at the interface; and applying mechanical force; whereby the second substrate and the at least one layer of material are jointly separated from the first substrate. Related arrangements are also described.

24 Claims, 6 Drawing Sheets

(51) Int. Cl.
   *B32B 37/24* (2006.01)
   *B32B 38/08* (2006.01)
   *C01B 31/04* (2006.01)

(52) U.S. Cl.
   CPC .... *H01L 21/0201* (2013.01); *H01L 21/67092* (2013.01); *H01L 21/67132* (2013.01); *B32B 2037/243* (2013.01); *B32B 2037/246* (2013.01)

(56) References Cited

U.S. PATENT DOCUMENTS

| | | |
|---|---|---|
| 2011/0123776 A1 | 5/2011 | Shin et al. |
| 2012/0031551 A1 | 2/2012 | Hsu |
| 2012/0231694 A1 | 9/2012 | Hamada et al. |
| 2012/0282419 A1 | 11/2012 | Ahn et al. |
| 2013/0032296 A1* | 2/2013 | Zhong .................... C11D 1/22 156/704 |
| 2013/0288458 A1* | 10/2013 | Wei ........................ H01L 21/20 438/478 |
| 2015/0068684 A1 | 3/2015 | Hong et al. |

FOREIGN PATENT DOCUMENTS

| | | |
|---|---|---|
| WO | 2011/159922 A2 | 12/2011 |
| WO | 2012067438 A2 | 5/2012 |

OTHER PUBLICATIONS

First Office Action and Search Report dated Jun. 30, 2016 corresponding to Chinese Patent Application No. 2013800725527, 4 pages.

English Translation of First Office Action dated Jun. 30, 2016 corresponding to Chinese Patent Application No. 2013800725527, 6 pages.

Wang, et al., "Electrochemical Delamination of CVD-Grown Graphene Film: Toward the Recyclable Use of Copper Catalyst," ACS Nano 2011, vol. 5, No. 12, pp. 9927-9933.

* cited by examiner

A
↓
B
↓

C' | Separate first rigid substrate from at least one layer of material and the second substrate by combination of mechanical force and bubbles formed at the interface

METHODS AND APPARATUS FOR TRANSFER OF FILMS AMONG SUBSTRATES

CROSS-REFERENCE TO EARLIER APPLICATIONS

This application is a continuation of U.S. application Ser. No. 14/099,032, filed Dec. 6, 2013, now U.S. Pat. No. 8,822,208, which claims priority under 35 U.S.C. 119 to U.S. Provisional Application No. 61/797,471 entitled Methods and Apparatus for Transfer of Films Among Substrates, filed Dec. 7, 2012, the entire content of which is hereby incorporated by reference.

BACKGROUND

The present application generally relates to methods and apparatus for transfer of films from one or more substrates to another.

In this specification where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

The discovery of graphene has generated widespread interest for potential use in electronic and other applications due to its electronic, optical, physical, and mechanical properties. Graphene is a single atomic layer of carbon atoms, tightly bonded in a hexagonal lattice. Despite its short history as an experimental system, graphene has already revealed exciting new physics including "relativistic" carriers with implications for quantum electronic transport and charge screening, a width-dependent energy band gap, extremely high carrier mobility, high elasticity and electromechanical modulation. The properties of graphene appeal to many industries, in particular electronics. Graphene's high carrier mobility and high thermal conductivity make it a potential alternative to silicon and diamond. Its properties may enable the creation of next generation solid-state devices (ballistic transistors, spin transistors, etc.). Graphene is also a candidate for use as a flexible, optically transparent conductor in applications such as touch displays and photovoltaics. Other potential applications include chemical sensors, nanopore filters, impermeable coatings for corrosion and/or chemical protection, ultracapacitors, TEM supports, and others.

The goal of low cost graphene sheets has driven recent research in methods of large area graphene production. Chemical vapor deposition of graphene on metal substrates is one promising method for large area, low cost, graphene production. One critical issue of graphene production is the handling of the graphene films and the transfer of those films from the deposition substrate to other substrates for many applications. Accordingly, there is a need for a large area process to transfer single layer or multi-layer graphene from one substrate to another substrate.

One current, widely used graphene transfer process includes a chemical etching step to remove the metal substrate by dissolution. Scaling this process to thousands of square meters production, leads to great expense and waste challenges. The reclamation or disposal of metal infused etchant constitutes a major cost and waste handling issue. Since the substrate is dissolved by the etchant, it cannot be reused for the growth of graphene films. In addition, the dissolution process is rather slow. For at least these reasons, this conventional technique is not well-suited for efficient, large-scale, low cost production of graphene films.

While certain aspects of conventional technologies have been discussed to facilitate disclosure of the invention, Applicants in no way disclaim these technical aspects, and it is contemplated that the claimed invention may encompass or include one or more of the conventional technical aspects discussed herein.

SUMMARY

The present invention may address one or more of the problems and deficiencies of the prior art discussed above. However, it is contemplated that the invention may prove useful in addressing other problems and deficiencies, or provides benefits and advantages, in a number of technical areas. Therefore the claimed invention should not necessarily be construed as being limited to addressing any of the particular problems or deficiencies discussed herein.

The present invention provides methods and apparatus which provide one or more of the following benefits and advantages:
  elimination or significant reduction of chemical waste and related environmental and cost benefits;
  allows for the reuse of metal substrates for future graphene formation, thereby reducing waste and improving the economics of the process;
  allows for a scalable, continuous process for graphene film creation, substrate transfer and/or multi-layer structure fabrication;
  allows graphene films to be placed on nearly any smooth surface;
  provides a process for transferring graphene films which are a single atomic layer thickness, as well as multi-layer graphene films;
  provides a process which can transfer Graphene to either flexible or rigid substrates;
  allows for the creation and transfer of large area sheets of Graphene film.

Thus, according to one aspect, the present invention provides a method comprising: forming at least one layer of material on at least part of a surface of a first substrate, wherein a first surface of the at least one layer of material is in contact with the first substrate thereby defining an interface; attaching a second substrate to a second surface of the at least one layer of material; forming bubbles at the interface; and applying mechanical force; whereby the second substrate and the at least one layer of material are jointly separated from the first substrate.

According to a further aspect, there is provided an arrangement for transferring at least one layer of material from a first substrate to a second substrate, the arrangement comprising: a supply roll comprising a roll of a composite material, the composite material comprising a first substrate, at least one layer of material in contact with the first substrate thereby defining an interface, and a second substrate attached to a second surface of the at least one layer of material; a vessel containing a solution, the solution comprising water and at least one electrolyte; a cathode defined at the composite material when disposed in the solution; an anode disposed in the solution at a location remote from the cathode; a power source connected to the cathode and anode; a first pickup roll, the first pickup roll attached to the second substrate/at least one layer of material; a second pickup roll, the second pickup roll attached to the first substrate; wherein the cathode is constructed and arranged so as to produce bubbles at the interface, and wherein the second pickup roll is constructed and arranged to pull the first substrate in a first direction, and the first pickup roll is constructed and arranged to pull the second substrate along with the at least one layer of material in a second direction, the first and second directions diverging from one another, thereby defining an angle of separation.

DETAILED DESCRIPTION

As used herein, the singular forms "a", "an" and "the" are intended to include the plural forms as well, unless the context clearly indicates otherwise. Additionally, the use of "or" is intended to include "and/or", unless the context clearly indicates otherwise.

According to certain aspects of the present invention there are provided methods of transferring graphene from a substrate on which it is formed to a second substrate. These methods attach the second substrate to the graphene, as described later, immerse the layers in a solution, and then use a mechanical pulling action to separate the graphene and second substrate from the original substrate with the aid of bubbles, formed electrolytically at the interface between the graphene and the metal, to push the two layers apart. An electrolysis cell is configured in the solution by electrically contacting the graphene and metal structure and a second electrode. This process is suitable for graphene films grown on conductive substrate. This process is especially suitable for scaling to larger area graphene films.

Certain illustrative, non-limiting embodiments of methods and arrangements according to the principles of the present invention are schematically depicted in FIGS. 1-5.

Figure 1:
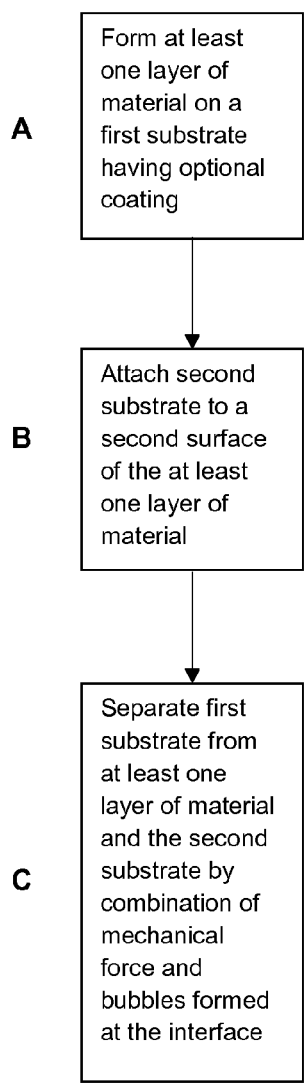
FIGS. 1A-1C' are schematic illustrations of methods performed according to certain aspects of the present invention.
Figure 1:
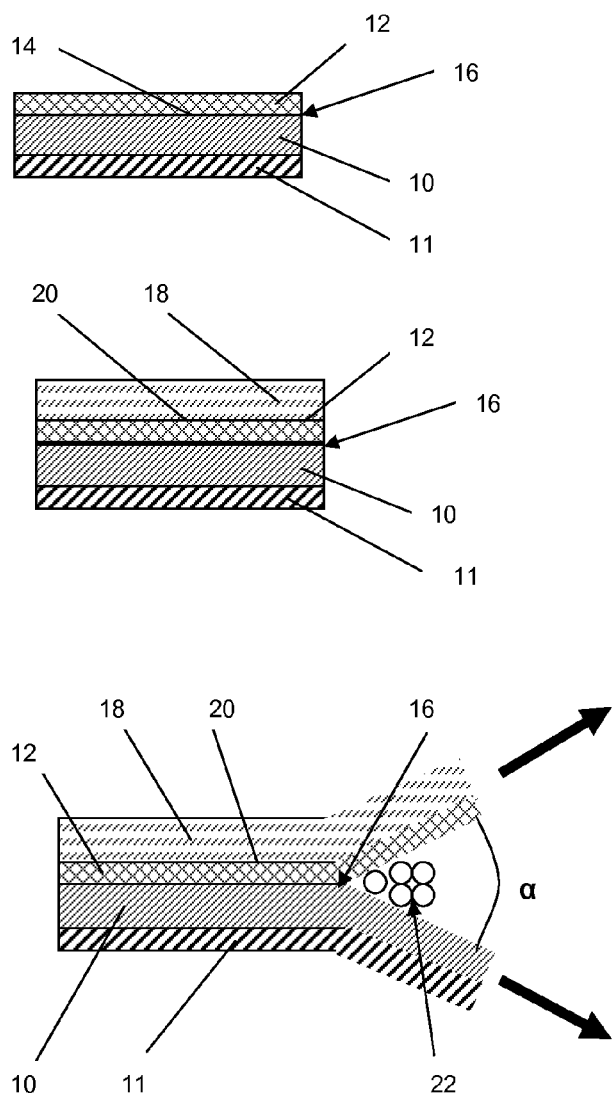

As illustrated, for example, in FIG. 1, at least one layer of material 12 can be formed on at least part of a surface of a first substrate 10 thereby forming an interface 16 between a first surface 14 of the at least one layer of material 12 and the substrate 10. The at least one layer material can be formed on part of a surface of the first substrate, for example, as a periodic pattern. Alternatively, the at least one layer of material 12 can cover the entire surface of the first substrate 10. The layer of material 12 can be formed as a single layer of material, or as multiple layers of material. The layer of material 12 can have any suitable thickness. The methods and arrangements of the present invention are advantageous with respect to thin layers, such as layers having a total thickness less than 10 nm. The at least one layer of material 12 can be formed from any suitable material, or combination of materials. According to certain embodiments, the at least one layer of material 12 comprises graphene. The graphene may be present as a single atomic layer of graphene, or as layers of graphene having a multiple-atom thickness. The graphene can be combined with one or more additional materials. For example, the graphene can be doped with one or more dopants. The dopant(s) can comprise iodine, nitrogen, boron, potassium, arsenic, gallium, aluminum, indium, or others. Graphene can be formed according to any suitable technique, generally known to those skilled in the art, such as exfoliation of graphite, epitaxial growth, oxide reduction of graphite, etching or division of carbon nanotubes, sonication of graphite, and carbon dioxide reduction reactions. According to certain embodiments of the present invention, graphene is grown on a substrate by chemical vapor deposition. According to further alternative embodiments, the graphene may be grown onto a planarized substrate under relatively low temperature, near atmospheric pressure, conditions. For example, the substrate 10 can be planarized by any suitable technique, such as electropolishing, mechanically polishing, and/or chemically polishing the surface thereof upon which graphene is to be grown. This surface of the substrate 10 is then contacted with a hydrocarbon gas (e.g., methane) at a temperature of about 250° C. to about 2000° C., and at a pressure of about $10^{-7}$ atmospheres to about ambient pressure. One suitable technique of forming graphene as the at least one layer material 12 upon the substrate 10 according to certain illustrative and non-limiting embodiments of the present invention is described in WO 2012/021677, the entire contents of which is incorporated herein by reference.

Regardless of the nature of the at least one layer of material 12, the first substrate 10 can be formed from any suitable material. The first substrate 10 can be flexible or rigid. According to certain illustrative examples, the substrate 10 can be formed of a metal. Specific non-limiting examples of metals that could be used to form the substrate 10 include copper, rhodium, ruthenium, iridium, platinum, cobalt, nickel, or any combination thereof. According to one illustrative non-limiting example, the substrate 10 is formed from copper.

As illustrated, for example, in FIG. 1, the first substrate 10 may have an optional layer or coating 11 applied to a surface thereof before or after the formation of material 12. The layer or coating 11 can be formed any suitable material or materials. For example, it can be formed of a polymer, such as polyethylene terephthalate (PET), Poly(methyl methacrylate) (PMMA), Polyethylene naphthalate (PEN), polyamide, polytetrafluoroethylene (PTFE), polyethylene, and others. The layer or coating may be applied by any suitable technique, such as adhesive attachment, laminating, coating, spraying, spin coating, dipping, and the like.

As further illustrated, for example, in FIG. 1, a second substrate 18 can be attached to a second surface of the at least one layer of material. The second substrate 18 can be formed from any suitable material, or combination of materials. According to certain non-limiting examples, the second substrate 18 can be formed from poly(methyl methacrylate) (PMMA) or polyethylene terephthalate (PET). Alternatively, the second substrate 18 could be formed from polyethylene (PE), polyvinylchloride (PVC), glass, silica, silicon dioxide, silicon, MgO, and others. The second substrate can be applied to the at least one layer of material by any suitable technique. Suitable techniques include, but not limited to adhesive attachment, laminating, coating, spraying, spin coating, dipping, and the like.

Next, the above described combination of materials can be separated or delaminated. This separation or delamination is achieved through a combination of the application of mechanical forces, with the assistance of bubbles 22 formed along the separation interface 16. This mechanism is schematically illustrated in FIG. 1 (C). The bubbles 12 can be formed by any suitable mechanism. According to one illustrative embodiment, the bubbles 22 are formed by the emission of hydrogen due to the electrolysis of water. This mechanism should be familiar to those skilled in the art. In water at the negatively charged cathode, a reduction reaction takes place, with electrons (e⁻) from the cathode being given to hydrogen cations to form hydrogen gas (the half reaction balanced with acid): Reduction at cathode: 2 H⁺(aq)+ 2e⁻→H₂(g). At the positively charged anode, an oxidation reaction occurs, generating oxygen gas and giving electrons to the anode to complete the circuit: Anode (oxidation): 2 H₂O(l)→O₂(g)+4 H⁺(aq)+4e⁻.

Specific optional embodiments for carrying out the electrolysis reaction noted above will be described later herein.

As further noted above, the other component utilized according to the principles of the present invention to delaminated or separate the aforementioned materials involve the application of mechanical force or pressure. This is schematically illustrated by the block arrows appearing in FIG. 1 (C). As illustrated therein, these forces are applied in directions which diverge from one another thereby defining a separation angle α. The effectiveness and efficiency of the delamination operation can be influenced through careful selection of the appropriate separation angle α, as well as the quantity of force applied. According to certain embodiments of the present invention, the separation angle α is about 1 degree to about 90 degrees, or about 5 degrees to about 60 degrees.

Figure 2:
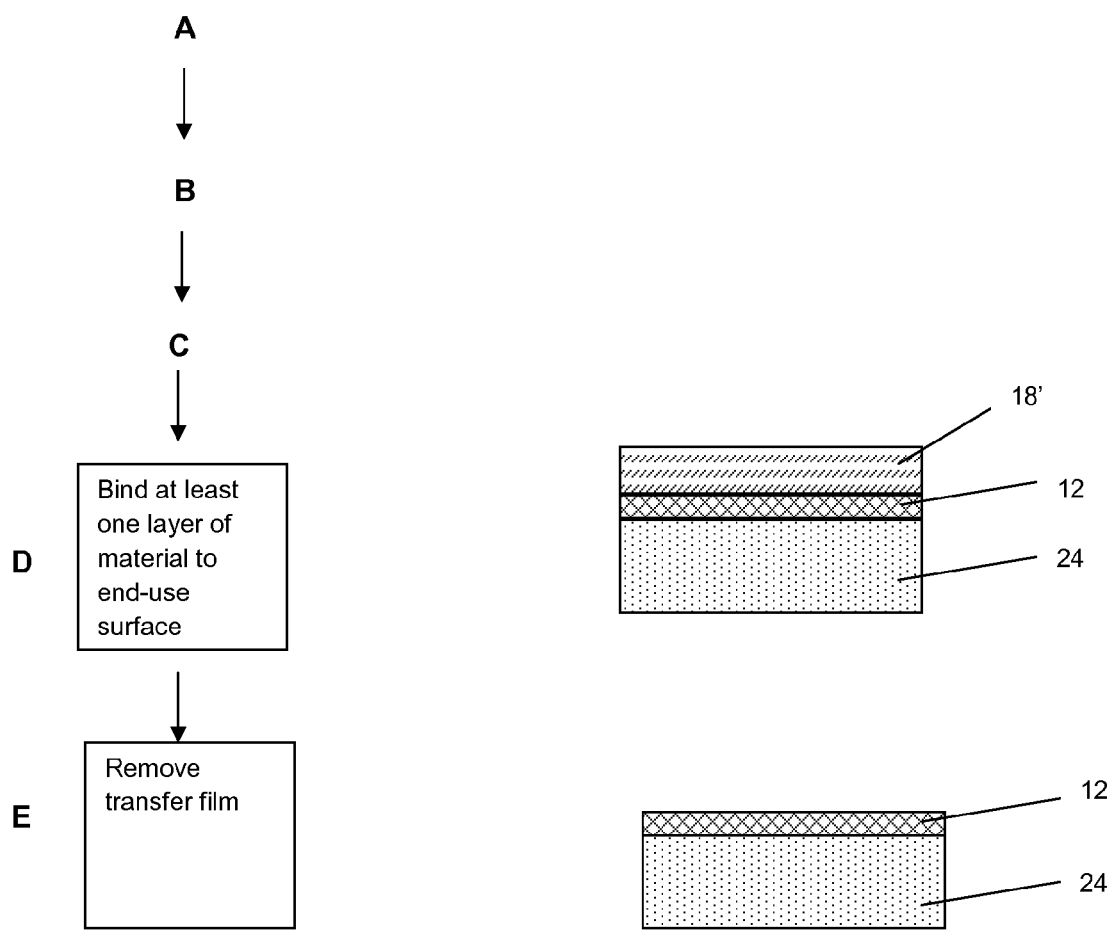
FIG. 2 is a schematic illustration of methods performed according to further aspects of the present invention.

According to a further alternative embodiment of the technique described above, the at least one layer of material 12 can be further transferred to an additional third substrate. An example of this alternative procedure is schematically illustrated in FIG. 2. As illustrated therein, the second substrate acts as a transfer film 18'. This transfer film 18' can be formed from any suitable material or combination of materials. It can be formed from the same material as the second substrate 18, as previously described above. Alternatively, the transfer film 18' can be formed from a different material such as heat transfer tape, PET, PE, PVC, PTFE, PMMA, and others. According to one specific, non-limiting example, the transfer film 18' can be formed from a thermally-sensitive adhesive which breaks down upon exposure to elevated temperatures. This permits a relatively simple mechanism for releasing the transfer film 18' from the at least one layer material 12. Subsequent to the separation of the first substrate 10 and optional layer or coating 11 from the at least one layer of material 12 and transfer film 18', a third substrate 24 is attached to a surface of the at least one layer material 12. See, e.g., FIG. 2 (D). Next, the transfer film 18' is removed from the at least one layer of material 12, leaving the at least one layer material 12 disposed upon the end-use substrate 24. This removal can be accomplished by any suitable technique, such as the above-mentioned heating of a thermally-sensitive adhesive, mechanical force, chemical separation techniques, chemical dissolution, chemical etching, photoinduced degradation, and depolymerization. One advantage of this alternative technique is that the at least one layer of material 12 can be transferred to a rigid substrate 24. Of course, the substrate 24 may also be flexible. The substrate 24 can be formed of any suitable material, such as a ceramic, metal or polymer. Specific illustrative, and non-limiting examples, include: silicon, glass, quartz, semiconductor films on rigid substrates.

Figure 3:
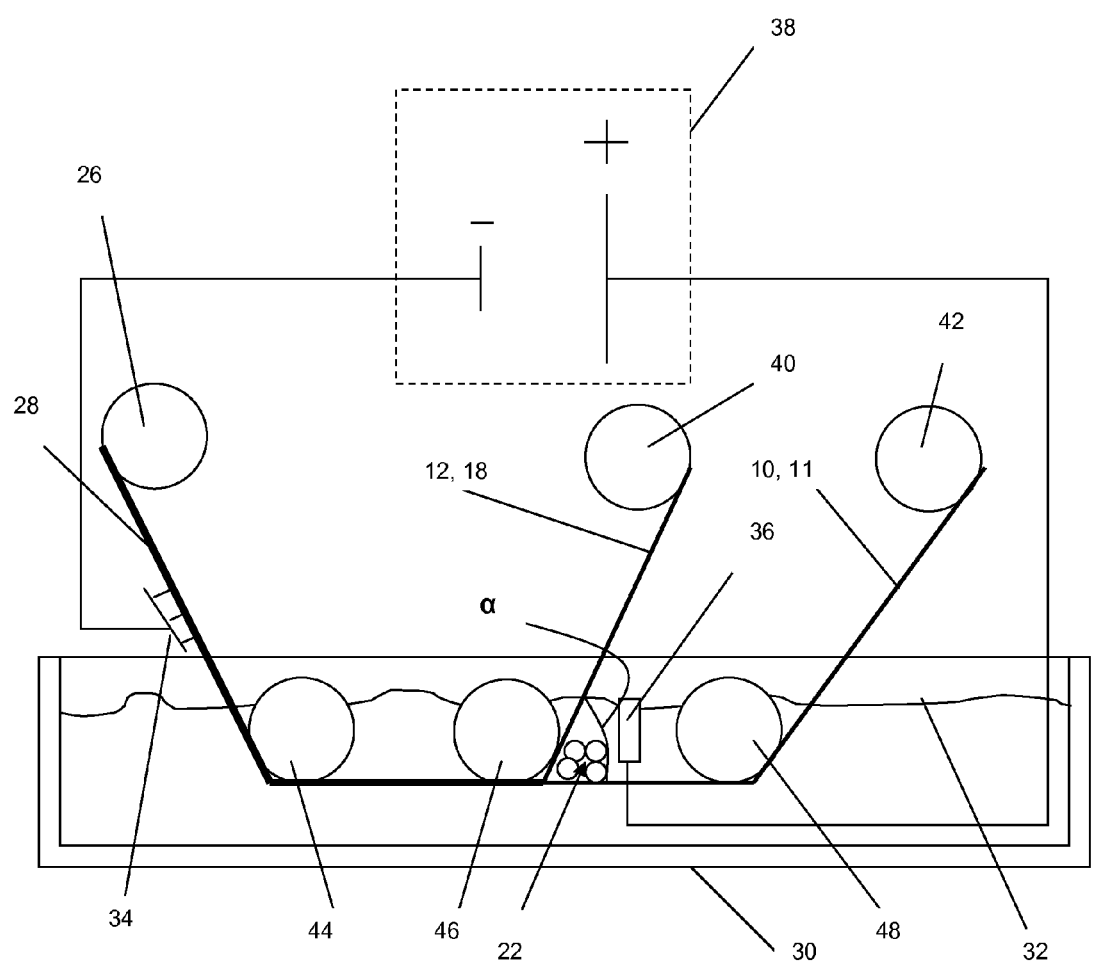
FIG. 3 is a schematic illustration of an arrangement, and related methods, configured according to the principles of the present invention.
Figure 4:
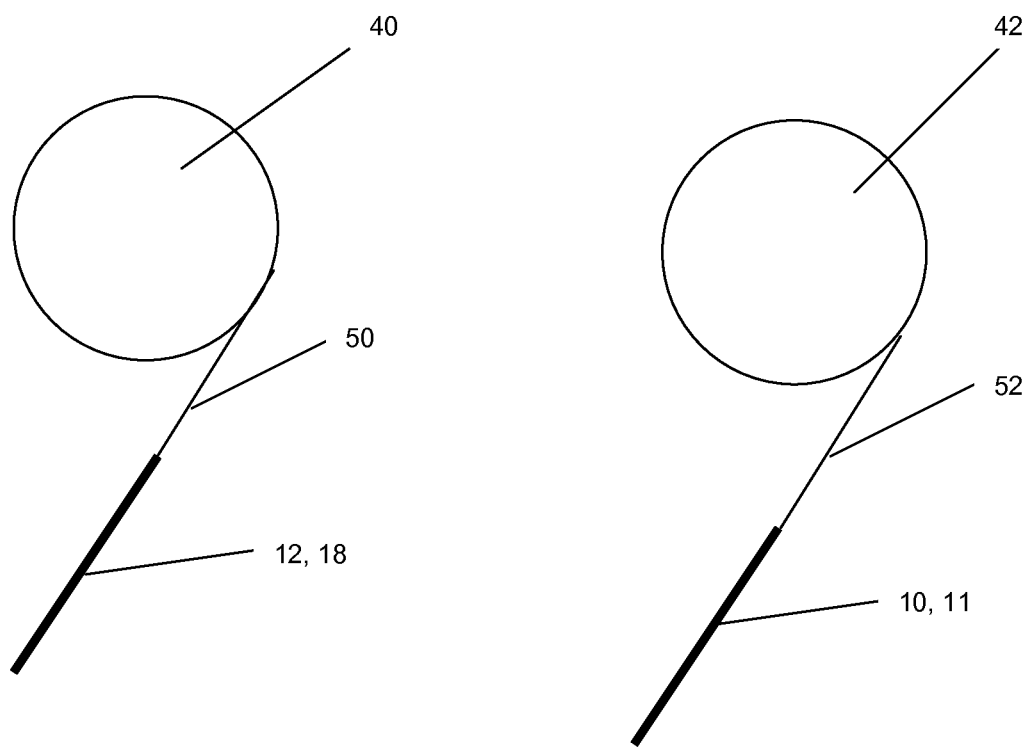
FIG. 4 is a schematic illustration of further optional aspects of methods and arrangements of the present invention.
Figure 5:
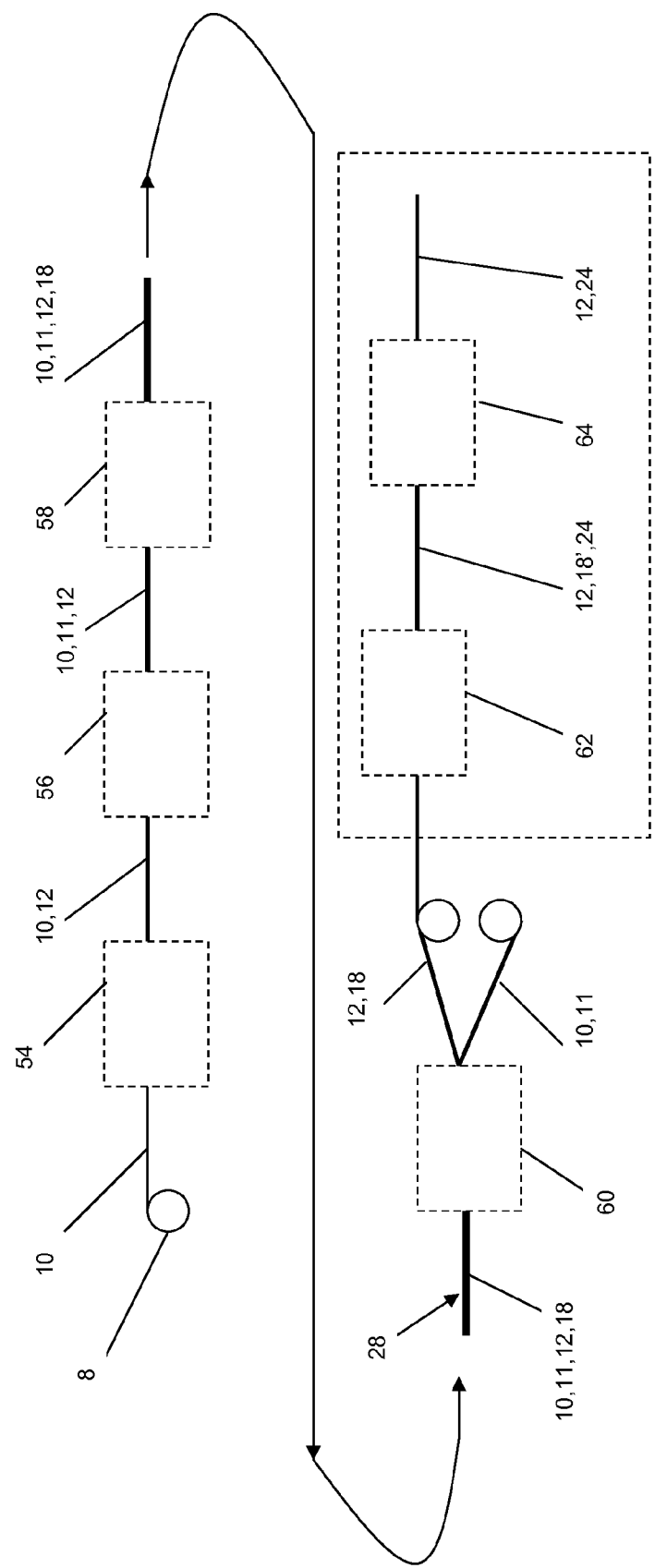
FIG. 5 is a schematic illustration of arrangements and methods according to additional aspects of the present invention.

The present invention also encompasses arrangements, which can be, for example, utilized to carry out the aforementioned methods. Arrangements constructed according to the principles of the present invention are illustrated in FIGS. 3-5. Those features illustrated therein which are also described above in connection with the aforementioned methods are identified using the same reference numerals utilized in FIGS. 1-2. As illustrated, for example, in FIG. 3, the aforementioned method can be implemented as a roll-to-roll process. The arrangement depicted in FIG. 3 is suitable for such roll-to-roll processes, but is not limited in this manner. As illustrated therein, the arrangement can comprise a number of different combinations of the illustrated features. For example, a supply roll 26 comprising a roll of composite material 28 can be provided. The composite material can comprise a first substrate 10, at least one layer material 12 in contact with the first substrate thereby defining interface 16, a second substrate 18 attached to a second surface of the at least one layer of material 12, and an optional additional layer or coating 11 disposed on a surface of the first substrate 10. These materials can take the specific forms or compositions previously mentioned above.

This composite material 28 is fed into what amounts to electrolytic cell by any suitable arrangement, such as one or more guide rollers 44, 46. The electrolytic cell comprises a vessel 30 containing a solution 32 the solution 32 comprises water and at least one electrolyte. Any suitable electrolyte, or combination of electrolytes, can be utilized. According to certain optional embodiments, the electrolyte comprises, for example, sodium hydroxide, potassium hydroxide, sulfuric acid, and/or sodium chloride. The solution comprises a 0.05 mole to 1 mole electrolyte per liter of water. Alternatively, the solution contains one or more dopant materials. Suitable dopants include, but are not limited to, iodine, nitrogen, boron, potassium, arsenic, gallium, aluminum, indium, chromium, or a number of organic molecules such as 2,3,5,6-Tetrafluoro-7,7,8,8-tetracyanoquinodimethane, 7,7,8,8-Tetracyano-2,3,5,6-tetrafluoroquinodimethane (F4-TCNQ). The solution may contain any suitable amount of dopant, which is highly dependent upon the dopant used.

For certain applications (e.g. a transparent conductor), important properties of the film may be refined and improved by doping the graphene. For example, with the proper doping, the electronic carrier density in the graphene will be increased, increasing conductivity for a transparent contact. As a two dimensional material, in which all the material is an exposed surface, graphene may be doped after deposition because there is no need for the dopant to diffuse to deeper layers (as there are none).

Doping of the graphene can be achieved during the transfer process by incorporating the dopant into the electrolyte solution. As the graphene is separated from the metal deposition substrate, it is exposed to the solution. The electrolyte in the solution or another additive serves as the dopant, adhering to the surface of the graphene during the process. The separation process does not require a particular electrolyte to function. The electrolyte increases the conductivity of the solution to enable charge transfer through the solution. There are many electrolyte additives which will increase the solution conductivity. Accordingly, solution additives may be selected and mixed to achieve a targeted doping density and an effective graphene-metal separation. The process can be controlled and refined through control of the electrolyte makeup and the exposure duration through the geometry of the separation bath.

The electrical bias on the graphene, which is part of one of the electrodes in the electrolysis cell, can be used to draw dopants to the graphene surface, where it bonds or is adsorbed.

The process may use more than one electrolyte. Multiple electrolytes can be used to control doping while maintaining the solution conductance for the separation process.

The cell is completed by forming a cathode 34 at the composite material, and anode 36 located at a distance from the cathode, or "remotely" relative thereto. In order to optimize the accuracy and efficiency of the delamination process, the anode can be located near the point of separation 16. Through placement of the anode, the formation of hydrogen bubbles can be focused toward the separation interface 16. In addition, the presence of the optional coating 11 on the first substrate 10 can serve to prevent electrolytic reaction on those surfaces of the first substrate 10 which is covered by the coating or layer 11, thereby effectively focusing the reaction at the interface 16 during the delamination or separation procedure. The cathode is negatively biased, and the anode is positively biased, and both are connected to a power source 38 which provides electrical current flows through the solution 32. Any suitable power source can be utilized and any appropriate voltage and current conditions can be applied. For example, the power source can be constructed and arranged to generate electrical current having a current density of 0.5 A/cm$^2$ and voltage of 10V. The voltage is highly dependent upon the positioning of the electrodes. The essential location for gas formation to occur is at the point of separation 16. Gas bubbling will occur at every exposed conductive surface of the composite material cathode that is immersed in the solution. Power source construction should account for all current flow at the point of separation and elsewhere. As a result, hydrogen is emanated in gaseous form at the cathode 34 (which is the composite material 28), specifically bubbles 22 are formed at least at the interface 16 between the first substrate 10 and the at least one layer of material 12.

Alternatively, the gas formation aiding the separation can be of a different composition by use of different chemistry and placement of anode and cathode. Other gas bubbling which may be employed by electrolysis or other electrochemical reactions include, for example, oxygen, nitrogen, or chlorine.

As further illustrated in FIG. 3, the arrangement may further comprise a first pickup roll 40 the first pickup roll is attached to the second substrate 18 and the at least one layer material 12 disposed on a surface thereon. Connection of these materials to the pickup roll 40 can be facilitated by the use of a leader film 50, as illustrated in FIG. 4. The leader film 50 can be formed from any suitable material, such as a polymer. Suitable polymers include PET, PMMA, polyamide, PTFE, and polyethylene. Through location of the first pickup roll 40, the second substrate 18 and material 12 is mechanically pulled in a first direction. The first substrate 10, and optional additional layer or coating 11, can be connected to a second pickup roll 42. As illustrated in FIG. 3, and optional guide roll 48 can be utilized to affect the direction by which the first substrate 10 and optional additional layer or coating 11 is pulled by the pickup roll 42. Therefore, as clearly illustrated in FIG. 3, the at least one layer of material 12 and the second substrate 18 travel away from the separation roller 46 in different directions. More specifically, according to the embodiment illustrated in FIG. 3, the first substrate 10 and optional coating 11 separate from the curved path of the separation roller 46 surface, while the at least one layer of material 12 and the second substrate 18 continue to follow the curved surface of the separation roller 46 for an additional distance before traveling away from the separation roller 46. Of course this arrangement can be modified according to alternative embodiments. For example, the relative position of the rollers and/or layers of the composite could be switched such that the at least one layer of material 12 and the second substrate 18 separate from the curved path of the separation roller 46 surface, while the first substrate 10 and optional coating 11 continued to follow the curved surface of the separation roller 46 for an additional distance before traveling away from the separation roller 46.

Again, the first substrate 10 and optional additional layer or coating 11 can be attached to the pickup roll 42 by a connection through a leader film 52, as illustrated in FIG. 4. The leader film 52 can be formed from any suitable material. One such material as a polymer, for example, any of the materials mentioned above in connection with the description of leader film 50 will suffice. As previously explained herein, the direction by which the second substrate 18 and at least one layer material 12 is pulled diverges from the direction in which the first substrate 10, and optional additional layer or coating 11, is pulled. This divergence defines a separation angle α. The separation angle can have any suitable value, depending on the nature of the delamination procedure, the amount of hydrogen gas or bubbles created at the interface, and a number of different factors. According to certain illustrative embodiments, an appropriate separation angle α is about 5 degrees to about 60 degrees. Thus, the combination of diverging mechanical forces and the creation of bubbles 22 at the separation interface 16 allows for the separation of layers from the composite material 28. According to the illustrated non-limiting embodiment, this technique is utilized to separate the second substrate 18 and at least one layer material 12 from the first substrate 10 and the optional coating or additional layer 11.

According to additional alternative aspects of the present invention, methods and arrangements are provided which constitute an in-line process. One non-limiting example of such methods and arrangements is schematically illustrated in FIG. 5. Those features illustrated therein which are also described above in connection with the aforementioned methods and arrangements are identified using the same reference numerals utilized in FIGS. 1-4. The various materials and components previously described and also identified in FIG. 5 can have any of the previously described characteristics compositions and/or configurations. As illustrated, for example, in FIG. 5, the methods and arrangements can begin with a first substrate 10. This first substrate 10 can be provided, optionally, in the form of a supply roll 8. At least one layer of material 12 is formed on at least part of a surface of the first substrate 10. The at least one layer of material 12 can be formed by any suitable technique, as previously described herein. According to one optional embodiment, the at least one layer of material 12 can comprise graphene can be deposited by a chemical vapor deposition technique. The specifics of this technique have been previously described above in connection with other embodiments and are incorporated herein by reference. In order to carry out the chemical vapor deposition of graphene, a chemical vapor deposition apparatus 54 is provided. The first substrate 10 can be continually fed through the chemical vapor deposition chamber 54 in order to deposit the at least one layer of material 12 thereon in a continuous manner.

The first substrate 10 and at least one layer material 12 exits the chemical vapor deposition chamber 54, and the first substrate 10 is optionally provided with an additional layer or coating 11 on another surface of the first substrate 10. This additional layer or coating 11 can be applied by any suitable technique as previously described herein. The appropriate apparatus for applying the additional layer or coating 11 schematically illustrated in FIG. 5 at element 56.

The first substrate 10 along with the at least one layer of material 12, and the optional additional layer or coating 11 is then combined with the second substrate 18. The second substrate 18 can be applied to a second surface of the at least one layer material in a continuous manner, utilizing any suitable technique. Exemplary techniques for application of the second substrate have been previously described above, and are incorporated herein by reference. The suitable apparatus for the application of the second substrate 18 according to the aforementioned suitable techniques is schematically illustrated in FIG. 5 at element 58.

After application of the second substrate 18, the resulting composite material 28 comprises a first substrate 10, at least one layer of material 12, second substrate 18, and optionally, the additional layer or coating 11. This composite material 28 is then subjected to a delamination or separation procedure. According to the illustrative embodiment, the first substrate 10, and optional additional layer or coating 11 is separated from the at least one layer of material 12 and the second substrate 18. While any suitable technique can be utilized for this delamination or separation, the methods and arrangements of the present invention described herein are particularly effective in this regard. Thus, for example, the arrangement of FIG. 3, and its related methods previously described herein, can be utilized to provide the continuous delamination or separation noted above. This arrangement is schematically illustrated in FIG. 5 at element 60. These delaminated or separated portions can be continually taken up on pickup rolls, as previously described herein.

Figure 1C:
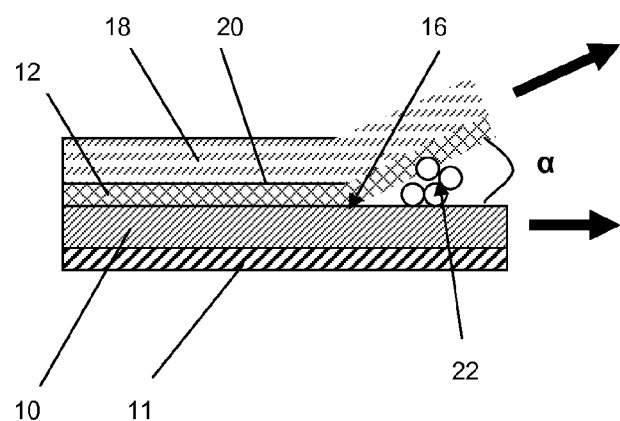

According to another embodiment, the process may be performed using a first substrate 10, as in the previous embodiment, except the first substrate 10 can be rigid. The first rigid substrate 10 can be fed through the chemical vapor deposition chamber 54 in order to deposit the at least one layer of material 12 thereon, as described earlier (e.g., FIG. 1A. FIG. 5). The first rigid substrate 10 along with the at least one layer of material 12, and the optional additional layer or coating 11 is then combined with the second substrate 18 (e.g., FIG. 1B). The second substrate 18 is composed of a flexible material can be applied to a second surface of the at least one layer material in a continuous manner, utilizing any suitable technique. This composite material 28 is then subjected to a delamination or separation procedure as illustrated in FIG. 1C'. According to the illustrative embodiment, the first rigid substrate 10, and optional additional layer or coating 11 is separated from the at least one layer of material 12 and the second substrate 18. According to a further optional embodiment, the process may continue so as to transfer the at least one layer of material 12 to a third substrate 24. In this alternative embodiment, the second substrate 18 acts as a transfer film 18'. This additional optional procedure and its associated components of the arrangement contained within the area delineated by the broken line in FIG. 5. As further illustrated therein, a third substrate 24 is applied to a surface of the at least one layer material 12 (see, e.g. FIG. 2). The third substrate 24 can be applied by any suitable technique, as previously described herein. The apparatus associated with the application of the third substrate 24 is schematically illustrated in FIG. 5 by element 62. Subsequently, the transfer film 18' is removed from the at least one layer of material by any suitable technique. These techniques include the delamination procedure of the present invention previously described herein, one embodiment of which being illustrated in FIG. 3. Additional removal techniques previously described may also be utilized and are incorporated herein by reference. The apparatus associated with removal of the transfer film 18' is schematically illustrated in FIG. 5 by element 64. The resulting structure is composed of the third substrate 24 and the at least one layer of material 12 disposed thereon. This alternative embodiment can be useful in the event that end-use substrate to which the at least one layer of material 12 is to be applied is relatively rigid and nature. Thus, the third substrate 24 can be a relatively rigid material formed from any suitable substance, as previously described in connection with the description of FIG. 2 above.

Other embodiments within the scope of the claims herein will be apparent to one skilled in the art from consideration of the specification or practice of the invention as disclosed herein. It is intended that the specification be considered exemplary only, with the scope and spirit of the invention being indicated by the claims.

In view of the above, it will be seen that the several advantages of the invention are achieved and other advantages attained.

As various changes could be made in the above methods and compositions without departing from the scope of the invention, it is intended that all matter contained in the above description shall be interpreted as illustrative and not in a limiting sense.

All references cited in this specification are hereby incorporated by reference. The discussion of the references herein is intended merely to summarize the assertions made by the authors and no admission is made that any reference constitutes prior art. Applicants reserve the right to challenge the accuracy and pertinence of the cited references.

Any numbers expressing quantities of ingredients, constituents, reaction conditions, and so forth used in the specification are to be understood as being modified in all instances by the term "about." Notwithstanding that the numeric al ranges and parameters setting forth, the broad scope of the subject matter presented herein are approximations, the numerical values set forth are indicated as precisely as possible. Any numerical value, however, may inherently contain certain errors or inaccuracies as evident from the standard deviation found in their respective measurement techniques. None of the features recited herein should be interpreted as invoking 35 U.S.C. §112, 6, unless the term "means" is explicitly used.

I claim:

1. A method comprising:
   forming at least one layer of material comprising graphene on at least part of a surface of a first substrate, wherein a first surface of the at least one layer of material is in contact with the first substrate thereby defining an interface;
   forming at least one layer of a second material on at least part of an opposing surface of the first substrate, wherein the at least one layer of the second material comprises a polymer;
   attaching a second substrate to a second surface of the at least one layer of material, the second surface opposing the first surface;
   forming bubbles at the interface; and
   applying mechanical force, wherein applying mechanical force comprises pulling the first substrate in a first direction, and pulling the second substrate along with the at least one layer of material in a second direction, the first and second directions diverging from one another, thereby defining an angle of separation, the angle of separation is about 1 degree to about 90 degrees;

whereby the second substrate and the at least one layer of material are jointly separated from the first substrate at the interface by the bubbles formed at the interface and the application of mechanical force.

2. The method of claim 1, wherein the at least one layer of material has a thickness less than 1 nm.

3. The method of claim 1, wherein the at least one layer of material comprises a single atomic layer or a plurality of atomic layers of graphene.

4. The method of claim 1, wherein the at least one layer of material is formed on the first substrate by chemical vapor deposition.

5. The method of claim 1, wherein the first substrate comprises copper, rhodium, ruthenium, iridium, platinum, cobalt, nickel, or any combination thereof, and the second substrate comprises a polymer.

6. The method of claim 1, wherein the first substrate comprises copper, and the second substrate comprises Poly (methyl methacrylate) (PMMA) or polyethylene terephthalate (PET).

7. The method of claim 1, wherein the second substrate is attached to the at least one layer of material by at least one of: adhering through adhesive, laminating, coating, spraying and dipping.

8. The method of claim 1, wherein forming bubbles at the interface comprises:
    forming a solution comprising water and electrolyte;
    immersing at least the interface in the solution;
    forming a cathode at the first substrate, at least one layer of material, and second substrate;
    disposing an anode in the solution at a location remote from the cathode; and
    connecting a power source to the cathode and anode, and passing electric current through the solution generated by the power source.

9. The method of claim 8, wherein the electrolyte comprises sodium hydroxide, potassium hydroxide, sulfuric acid, and/or sodium chloride, and the solution comprises a 0.05 mole to 1 mole electrolyte per liter of water; the electric current has a current density of 0.1-2 A/cm2.

10. The method of claim 8, wherein the anode is disposed near the point of separation.

11. The method of claim 1, wherein one of the first or second substrate is less flexible than the other substrate.

12. The method of claim 11, further comprising attaching the at least one layer of material to a third substrate, and removing the second substrate.

13. The method of claim 1, wherein:
    the first substrate is provided in the form of a supply roll;
    the at least one layer of material is formed thereon in a continuous manner;
    the second substrate is applied to the second surface of the at least one layer of material in a continuous manner;
    the second substrate and the at least one layer of material are collected in a continuous manner on a first pickup roll; and
    the first substrate is collected in a continuous manner on a second pickup roll.

14. The method of claim 1, further comprising attaching a first leader film to the second substrate and at least one layer of material, and attaching a second leader film to the first substrate.

15. An arrangement for transferring at least one layer of material from a first substrate to a second substrate, the arrangement comprising:
    a supply roll comprising a roll of a composite material, the composite material comprising a first substrate, at least one layer of material comprising graphene in contact with the first substrate thereby defining an interface, the composite material further comprises a second material on at least part of an opposing surface of the first substrate, and wherein the at least one layer of the second material comprises a polymer, and a second substrate attached to a second surface of the at least one layer of material;
    a vessel containing a solution, the solution comprising water and at least one electrolyte;
    a cathode defined at the composite material when disposed in the solution;
    an anode disposed in the solution at a location remote from the cathode;
    a power source connected to the cathode and anode;
    a first pickup roll, the first pickup roll attached to the second substrate/at least one layer of material;
    a second pickup roll, the second pickup roll attached to the first substrate;
    wherein the cathode is constructed and arranged so as to produce bubbles at the interface, and wherein the second pickup roll is constructed and arranged to pull the first substrate in a first direction, and the first pickup roll is constructed and arranged to pull the second substrate along with the at least one layer of material in a second direction, the first and second directions diverging from one another, thereby defining an angle of separation, the angle of separation is about 1 degree to about 90 degrees.

16. The arrangement of claim 15, wherein the at least one layer of material comprises a single atomic layer or a plurality of atomic layers of graphene.

17. The arrangement of claim 15, wherein an anode is defined at the composite material when disposed in the solution, and a cathode is disposed in the solution at a location remote from the anode.

18. The arrangement of claim 15, wherein the first substrate comprises copper, rhodium, ruthenium, iridium, platinum, cobalt, nickel, or any combination thereof, and the second substrate comprises a polymer.

19. The arrangement of claim 15, wherein the first substrate comprises copper, and the second substrate comprises Poly(methyl methacrylate) (PMMA) or polyethylene terephthalate (PET).

20. The arrangement of claim 15, wherein the first substrate, and second substrate along with the at least one layer of material travel away from a separation roller in different directions.

21. The arrangement of claim 20, wherein the first substrate separates from a curved roller surface, as the second substrate along with the at least one layer of material continues to follow the curved roller surface for an additional distance before traveling away from the roller.

22. The arrangement of claim 20, wherein the second substrate along with the at least one layer of material separates from a curved roller surface, as the first substrate continues to follow the curved roller surface for an additional distance before traveling away from the roller.

23. The arrangement of claim 15, wherein one of the first or second substrate is less flexible than the other substrate.

24. A method comprising:
forming at least one layer of material comprising graphene on at least part of a surface of a first substrate, wherein a first surface of the at least one layer of material is in contact with the first substrate thereby defining an interface;
attaching a second substrate to a second surface of the at least one layer of material, the second surface opposing the first surface;
forming bubbles at the interface, wherein forming bubbles at the interface comprises:
  forming a solution comprising water and electrolyte;
  immersing at least the interface in the solution;
  forming a cathode at the first substrate, at least one layer of material, and second substrate;
  disposing an anode in the solution at a location remote from the cathode; and
  connecting a power source to the cathode and anode, and passing electric current through the solution generated by the power source; and
applying mechanical force, wherein applying mechanical force comprises pulling the first substrate in a first direction, and pulling the second substrate along with the at least one layer of material in a second direction, the first and second directions diverging from one another, thereby defining an angle of separation, the angle of separation is about 1 degree to about 90 degrees;
whereby the second substrate and the at least one layer of material are jointly separated from the first substrate at the interface by the bubbles formed at the interface and the application of mechanical force.

* * * * *